United States Patent [19]

Neyens et al.

[11] Patent Number: 4,540,958

[45] Date of Patent: Sep. 10, 1985

[54] ZERO IF FREQUENCY-MODULATOR

[75] Inventors: Edward J. Neyens; John G. Vaal, both of Ft. Wayne, Ind.

[73] Assignee: International Telephone and Telegraph Corporation, New York, N.Y.

[21] Appl. No.: 538,045

[22] Filed: Sep. 30, 1983

[51] Int. Cl.³ .............................................. H03C 3/00
[52] U.S. Cl. .................................. 332/16 R; 455/42; 455/102; 332/22
[58] Field of Search .............. 332/16 R, 19, 22, 23 R; 455/42, 75, 76, 102, 110, 113

[56] References Cited

U.S. PATENT DOCUMENTS 4,438,413  3/1984  Ryan .................................. 332/16 R Primary Examiner—Eugene R. LaRoche
Assistant Examiner—Robert J. Pascal
Attorney, Agent, or Firm—John T. O'Halloran; Peter R. Ruzek

[57] ABSTRACT

An apparatus for frequency-modulating telecommunication carriers with baseband signals includes an arrangement for generating two quadrature-related baseband signals in two separate channels, wherein each of the quadrature-related baseband signals is a sinusoidal function of the instantaneous angle of the message signal to be transmitted. The apparatus further includes an arrangement for producing a frequency-modulated carrier from the quadrature-related baseband signals, this arrangement including a device that provides two quadrature-related carrier-frequency waveforms, two mixing devices each for individually mixing one of the quadrature-related carrier-frequency waveforms with one of the quadrature-related baseband signals in one of the channels, and a combining device which combines the output signals from the two channels into a single frequency-modulated carrier-frequency output signal.

21 Claims, 10 Drawing Figures

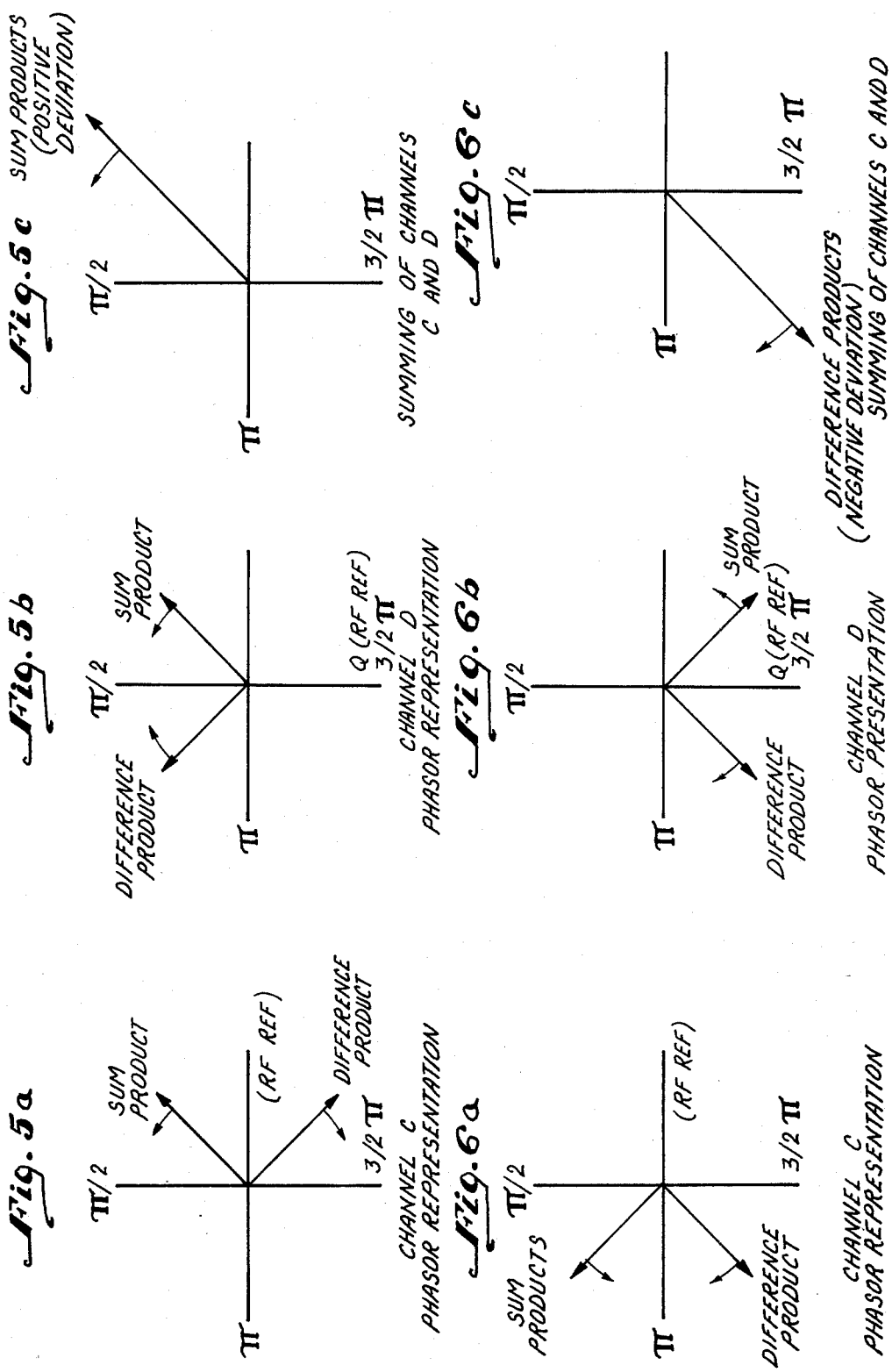

4,540,958

ZERO IF FREQUENCY-MODULATOR

BACKGROUND OF THE INVENTION

The present invention relates to frequency modulation in general, and more particularly to a method of and arrangement for frequency-modulating telecommunication carriers with baseband signals.

As well known in the art, baseband signals which contain the information to be transmitted and which will hereafter be referred to as message signals are modulated onto a carrier in order to facilitate or enable transmission over considerable distances. Various modulation techniques are known including frequency modulation with which the present invention is concerned.

There are two basic ways to accomplish frequency modulation at a desired carrier frequency. One is to modulate the local or reference oscillator in a synthesizer loop by the baseband message signal. A problem with this approach is the inability to maintain a linear relationship between the baseband signal amplitude and the carrier deviation when the carrier frequencies change. The other known approach is to modulate an oscillator at a non-zero intermediate frequency which is then translated to the desired carrier frequency by a third frequency. Even this approach has certain drawbacks. So, for instance, additional complicated control circuitry is required for the selection of a proper third frequency, and additional hardware must be provided, this hardware operating at radio frequency, resulting in interference problems.

SUMMARY OF THE INVENTION

Accordingly, it is a general object of the present invention to avoid the disadvantages of the prior art.

More particularly, it is an object of the present invention to provide a frequency modulator which does not possess the disadvantages of the known frequency modulators.

It is yet another object of the present invention to develop a modulator of the type here under consideration in which most of the signal processing is performed within the baseband range where integrated circuit technology is well established.

Still another object of the present invention is to so construct the frequency modulator of the above type as to make full use of integrated circuit technology for the signal processing in the baseband range.

A concomitant object of the present invention is so to design the modulator as to be simple in construction, inexpensive to manufacture, small in size, easily incorporatable into transceivers, and reliable in operation nevertheless.

In pursuance of these objects and others which will become apparent hereafter, one feature of the present invention resides in an arrangement for frequency-modulating telecommunication carriers with baseband signals, this arrangement comprising means for generating two quadrature-related baseband signals in two separate channels, each of these quadrature-related baseband signals being a sinusoidal function of the instantaneous angle of a message signal to be transmitted; and means for producing a frequency-modulated carrier from the quadrature-related baseband signals, including means for providing two quadrature-related carrier-frequency waveforms, means for individually mixing one of the quadrature-related carrier-frequency waveforms with one of the quadrature-related baseband signals in one of the channels and the other carrier-frequency waveform with the other of the baseband signals in the other channel to form respective first and second signals in the one and the other channel, and means for combining the first and second signals from the channels into a single frequency-modulated carrier-frequency output signal.

BRIEF DESCRIPTION OF THE DRAWING

Above-mentioned and other features and objects of this invention will become more apparent by reference to the following description taken in conjunction with the accompanying drawings in which:

FIG. 4 is a circuit diagram of the modulation translator of FIG. 1;

FIGS. 5a to 5c are diagrammatic phasor representations of the signals appearing in channels C and D and of the frequency modulated RF output as indicated in FIG. 4 when the baseband signal in the channel A leads that in the channel B by 90°; and FIGS. 6a to 6c are views corresponding to those of FIGS. 5a to 5c but with the baseband signal in the channel B leading that in the channel A by 90°.

DETAILED DESCRIPTION OF THE PREFERRED EMBODIMENTS

Figure 1:
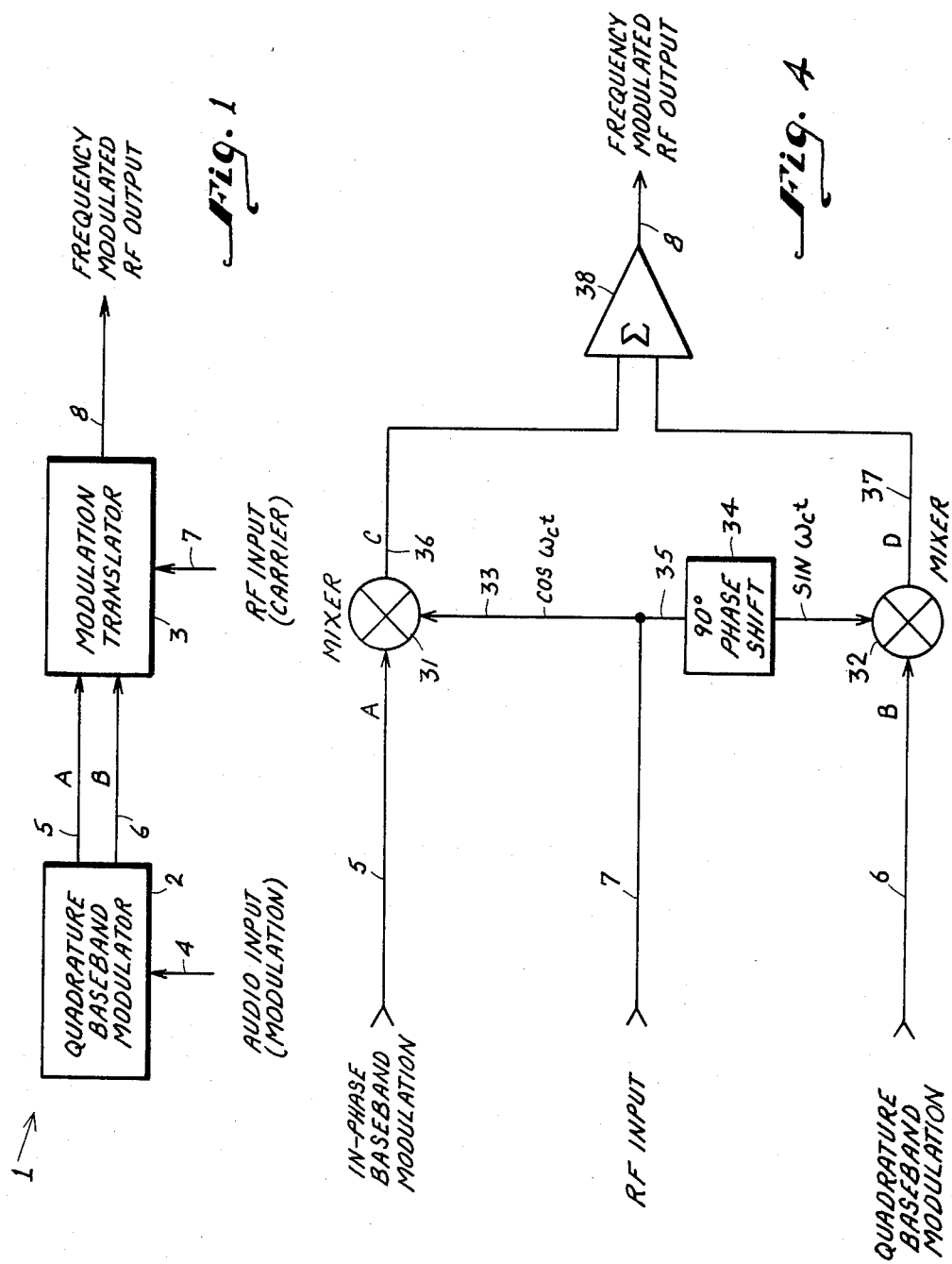
FIG. 1 is an overall diagram of the frequency modulator of the present invention.

Referring now to the drawing in detail, and first to FIG. 1 thereof, it may be seen that the reference numeral 1 has been used to identify a frequency modulator of the present invention in its entirety. The frequency modulator 1 includes, as its basic components, a quadrature baseband modulator 2 and a modulation translator 3 which will be discussed in more detail below. The quadrature baseband modulator 2 has a single input 4 through which the message signal to be transmitted, usually but not exclusively an audio signal, is fed to the quadrature baseband modulator 2, and two outputs 5 and 6 which will be hereafter referred to as channels A and B and which individually connect the quadrature baseband modulator 2 to the modulation translator 3. The modulation translator further has another input 7 through which an RF input or carrier is supplied to the modulation translator 3. The modulation translator 3 also has a single output 8 at which frequency modulated RF output appears and which is connected, for instance, to a transmitting antenna.

Figure 2:
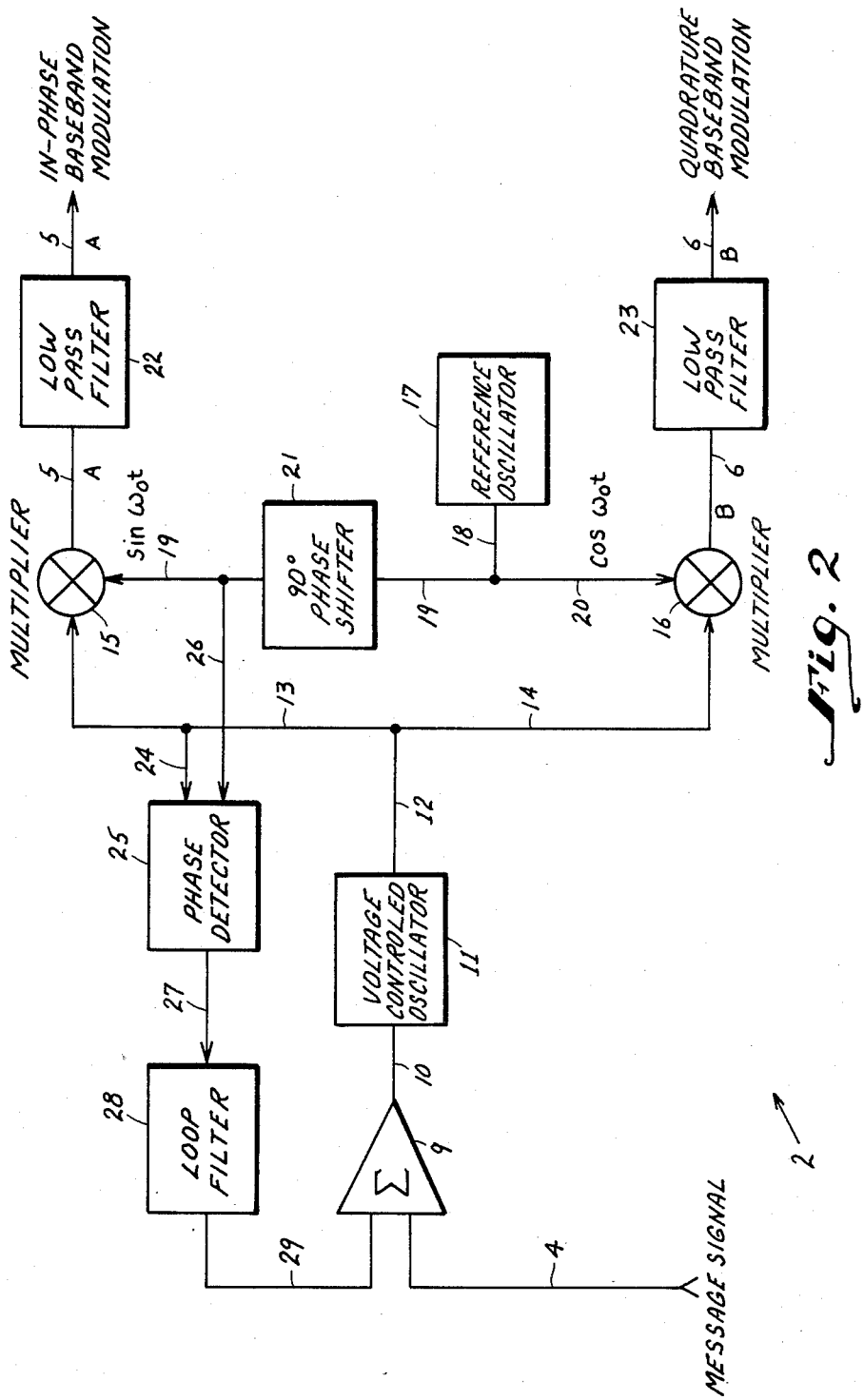
FIG. 2 is a circuit diagram of one version of the quadrature baseband modulator of FIG. 1.

Turning now to FIG. 2 for the details of one version of the quadrature baseband modulator 2, it may be seen that the latter includes a summing arrangement 9 to which the message signal input 4 is connected. An output 10 of the summing arrangement 9 is connected to the input of a voltage controlled oscillator 11 which has an output 12. The output 12 of the voltage controlled oscillator 11 is connected to two separate branches 13 and 14 leading to respective multipliers 15 and 16.

The quadrature baseband modulator 2 further includes a reference oscillator 17 having an output 18. The output 18 of the reference oscillator 17 is connected to two separate branches 19 and 20 which also lead to the respective multipliers 15 and 16. A 90° phase shifter 21 is shown to be interposed in the branch 19 between the output 18 of the reference oscillator 17 and the multiplier 15; however, it could also be interposed between the output 18 and each of the branches 19 and 20. In each instance, the 90° phase shifter receives the sinusoidal function appearing at the output 18 of the reference oscillator 17 and modifies the same in such a manner that quadrature-related sinusoidal functions appear in the respective branches 19 and 20. The respective multipliers 15 and 16 multiply the signals appearing in the respective branches 13 and 19, on one hand, and 14 and 20, on the other hand, with one another and the thus generated baseband signals issue into the respective channels A and B. Respective low pass filters 22 and 23 are interposed in the respective channels A and B.

A connecting branch 24 branches off from the branch 13 and leads to one input of a phase detector 25 to supply the same with information as to the instantaneous phase of the output of the voltage controlled oscillator 11. Furthermore, a connecting branch 26 leads from the branch 19 downstream of the phase shifter 21 to another input of the phase detector 25 to furnish thereto information as to the instantaneous phase of the respective sinusoidal function derived from the output of the reference oscillator 17. The phase detector 25 has an output 27 which is connected to a loop filter 28 with a low-pass characteristic. An output 29 of the loop filter 28 is connected to another input of the summing arrangement 29 to be combined with the message signal received from the input 4 and thus to influence the voltage level appearing at the output 10 and thus the voltage level controlling the operation of the voltage controlled oscillator 11.

In operation of the arrangement shown in FIG. 2, where there is no message signal, the voltage controlled oscillator 11 is phase locked to the reference signal originating at the reference oscillator 17 and supplied to the phase detector 25 via the connecting branch 26. The phase detector 25 is a digital edge triggered type which provides for approximately 0° phase difference. Because of the filtering in the loop filter 28, the output of the voltage controlled oscillator 11 is $\sin \omega_0 t$ in the absence of any message signal from the input 4.

The loop filter 28 has a very low corner frequency (approximately 1 Hz) which allows the audio input (300–3,000 Hz) to deviate the voltage control oscillator 11. This change in frequency may be expressed as a change in phase ($\theta_m(t)$). The voltage controlled oscillator 11 acts as an integrator; thus, the output of the voltage controlled oscillator 11 with an audio input will be $$\sin [\omega_0 t + \theta_m(t)]$$

The inputs to the multiplier 15 are:

$$\sin[\omega_0 t + \theta_m(t)]$$

$$\sin \omega_0 t$$

The inputs to the multiplier 16 are:

$$\sin [\omega_0 t + \theta_m(t)]$$

$$\cos \omega_0 t$$

To simplify the results, allow the multipliers 15 and 16 to have a gain of 2. Then:

output of multiplier $15 = -\cos [2\omega_0 t + \theta_m(t)] + \cos \theta_m(t)$ output of multiplier $16 = \sin [2\omega_0 t + \theta_m(t)] + \sin \theta_m(t)$ The low pass filters 22 and 23 will strip away the higher frequency components and the channel outputs will be:

channel A output $= \cos \theta_m(t)$ channel B output $= \sin \theta_m(t)$

If $\theta_m(t)$ is a negative value then:

channel A output $= \cos - [\theta_m(t)]$ channel B output $= -\sin - [\theta_m(t)]$ This causes a 90° phase shift between the two channels A and B. Thus, it may be seen that the signal in the channel A will lead the signal in the channel B in the first instance, and lag the same in the second instance.

Figure 3:
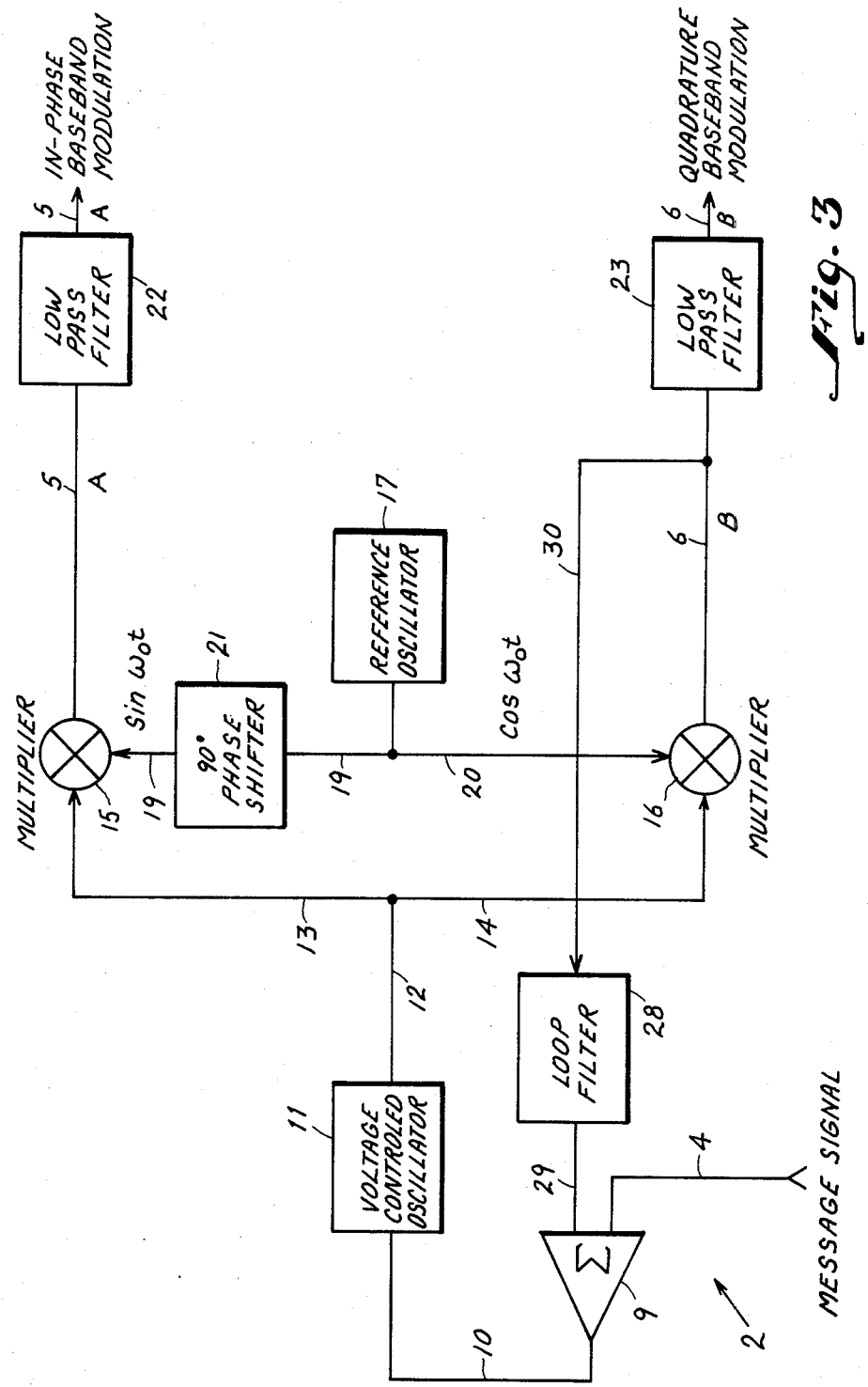
FIG. 3 is a view similar to FIG. 2 but of a different version of the quadrature baseband modulator of FIG. 1.

The modified version of the quadrature baseband modulator 2 which is depicted in FIG. 3 is so similar to and has so many components in common with the version described above in connection with FIG. 2 that the same reference numerals as above have been used to identify identical or similar components and connections thereof, and that the description of this version need only focus on the differences between the two circuits since the basic operation is substantially the same. In the quadrature baseband modulator 2 of FIG. 3, the phase detector 25 has been omitted in that its effect was achieved in a different manner. More particularly, a connecting branch 30 derives the signal from the channel B downstream of the multiplier 16 and feeds the same to the loop filter 28. It will be appreciated that, since the branching-off point of the branch 30 is located downstream of the multiplier 16, the signal carried by the branch 30 contains information as to the difference between the phase of the signal issued by the reference oscillator 17 and the instantaneous angle of the output of the voltage controlled oscillator 11.

More particularly, in operation, when there is no message signal at the input 4, the voltage controlled oscillator 11 is again phase locked to the reference signal issued by the reference oscillator 17. The phase relationship for the multiplier 16 used as a phase detector is 90° for the two inputs. Thus, the output of the voltage control oscillator 11 with no message signal input will be $\sin \omega_0 t$.

In a similar manner to that described above in connection with FIG. 2, the loop filter 28 will allow the message signal input at 4 to deviate the frequency of the voltage controlled oscillator 11. The output of the voltage controlled oscillator 11 will again be $\sin [\omega_0 t + \theta_m(t)]$.

The inputs to multiplier 15 are:

$$\sin [\omega_0 t + \theta_m(t)]$$

$$\sin \omega_0 t$$

The inputs to multiplier 16 are:

$$\sin [\omega_0 t + \theta_m(t)]$$

$$\cos \omega_0 t$$

To simplify the results the multipliers 15 and 16 will have a gain of 2. Then:

output of the multiplier $15 = -\cos[2\omega_0 t + \theta_m(t)] + \cos\theta_m(t)$ output of the multiplier $16 = \sin[2\omega_0 t + \theta_m(t)] + \sin\theta_m(t)$ The low-pass filters 22 and 23 will strip away the higher frequency components and the channel outputs will be:

channel A output $= \cos\theta_m(t)$ channel B output $= \sin\theta_m(t)$

If $\theta_m(t)$ is a negative value then the channel outputs will have a 90° change in their phase relationship and will be:

channel A output $= \cos -[\theta_m(t)]$ channel B output $= -\sin -[\theta_m(t)]$ Here again, the lead-lag relationship between the channels A and B is reversed.

FIG. 4 shows the details of the modulation translator 3 of FIG. 1. The baseband signals generated in the above-discussed manner in the respective channels A and B are respectively supplied to mixers 31 and 32. The carrier waveform to be modulated, which is supplied through the input 7, for instance, from a local oscillator operating at the respective carrier frequency $\omega_c$, is supplied directly through a connecting branch 33 to the mixer 31, and through a 90° phase shifter interposed in a branch 35 to the mixer 32. The mixers 31 and 32 have respective outputs 36 and 37 which are designated as channels C and D for reference purposes. The channels C and D are supplied to a summing arrangement 38 having an output connected to the output line 8. The operation of the modulation translator 3 is as follows:

The modulation translator 3 is effectively a phase modulator which mathematically can be represented by quadrature forms of the RF carrier multiplied by the two zero frequency baseband modulation signals and then combined, such that:

$$X(t) = X_o \sin\omega_c t \sin\theta_m(t) + X_o \cos\omega_c t \cos\theta_m(t)$$

where:
X(t) is the frequency modulated carrier
$X_o$ is the carrier amplitude
$\omega_c$ is the carrier frequency
Let $X_o = 1$ and then when $\theta_m(t)$ is a positive value:

$$\sin\omega_c t \sin\theta_m(t) = \tfrac{1}{2}[\cos(\omega_c t - \theta_m(t)) - \cos(\omega_c t + \theta_m(t))]$$

and $$\cos\omega_c t \cos\theta_m(t) = \tfrac{1}{2}[\cos(\omega_c t - \theta_m(t)) + \cos(\omega_c t + \theta_m(t))]$$

then:

$$X(t) = \cos(\omega_c t - \theta_m(t))$$

When $\theta_m(t)$ is a negative value:

$$\sin\omega_c t \sin\theta_m(t) = -\tfrac{1}{2}[\cos(\omega_c t - \theta_m(t)) - \cos(\omega_c t + \theta_m(t))]$$

$$\cos\omega_c t \cos\theta_m(t) = \tfrac{1}{2}[\cos(\omega_c t - \theta_m(t)) + \cos(\omega_c t + \theta_m(t))]$$

then:

$$X(t) = \cos(\omega_c t + \theta_m(t))$$

It may be seen from the above explanation that the modulator 1 of the present invention uses a phase-locked loop circuit to produce modulation at a zero intermediate frequency. The channels A and B carry the quadrature components which are required to convey the polarity of the deviation which is lost at zero frequency because of the spectrum fold-over in each channel. The deviation of polarity is contained in the phase relationship between the two channels. As mentioned before, the signal in channel A will lead that in channel B by 90° when the deviation is positive, and the signal in the channel B will lead that in the channel A by 90° when the deviation is negative.

The modulation translator 3 of the zero IF frequency modulator 1 imposes the baseband signals received from the channels A and B on the carrier (output of the local oscillator). This direct carrier modulation is accomplished by mixing the quadrature components of the modulation at zero frequency with quadrature components of the carrier frequency and summing the outputs of the two mixers 31 and 32. The channels C and D contain both the sum and difference products of the input frequencies. The unique relationship of the quadrature components at the zero and carrier frequencies causes a phase combination of either the sum or difference products in dependence on the lead-lag relationships between the signals in the channels A and B.

This can be easily perceived from a comparison of FIGS. 5a to 5c with FIGS. 6a to 6c. FIGS. 5a to 5c illustrate exemplary relationships between the sum and difference products in the channel C and D, and the result of the summation as it appears at the output 8 of the summing arrangement 38 when the deviation $\theta_m(t)$ is positive. On the other hand, FIGS. 6a to 6c show the same quantities but for $\theta_m(t)$ being negative. It may be seen that the difference products from the channels C and D cancel each other out in the summing arrangement 38 while the sum products are added to one another in the situation depicted in FIGS. 5a to 5c while the sum products from the channels C and D cancel each other out and the difference products are added to one another in the summing arrangement 38 in the situation shown in FIGS. 6a to 6c.

It should be appreciated that the phasor representations contained in FIGS. 5a to 5c and 6a to 6c show only one possible relationship between the reference RF quadrature component and the phase of the sum and difference products. However, the phase relationship between the two sum products as well as that between the difference products is accurate. This relationship is a function of the phase of the quadrature modulation signals and causes summing of one and canceling of the other product as shown in the phasor diagrams of FIGS. 5c and 6c.

It will be understood that other components of the modulator 1 which have been shown only in box form are of conventional constructions readily available to those active in the field of radio engineering, so that a detailed description thereof is deemed unnecessary.

It may be seen from the above description that, with the exception of the modulation of the two baseband signals onto a transmission carrier, the processing of the message input signal and of the signals derived from the voltage controlled oscillator 11 and the reference oscillator 17 of FIGS. 2 and 3 is performed at baseband frequencies, so that it can be easily accomplished by resorting to well-developed integrated circuit techniques. The components incorporated in the circuitry of the modulating arrangement, as well as many of the inter connections therebetween may also be commonly used by a demodulator for incoming signals in a common transceiver circuitry, thus resulting in substantial saving of hardware.

While we have described above the principles of our invention in connection with specific apparatus, it is to be clearly understood that this description is made only by way of example and not as a limitation to the scope of our invention as set forth in the objects thereof and in the accompanying claims.

We claim:

1. An arrangement for frequency-modulating telecommunication carriers with baseband signals, comprising means for generating two quadrature-related baseband signals in two separate channels, said quadrature-related baseband signals being respective in-phase and quadrature sinusoidal functions of the instantaneous angle of a message signal to be transmitted; and means for producing a frequency-modulated carrier from said quadrature-related baseband signals, including means for providing two quadrature-related carrier-frequency waveforms, means for individually mixing one of said quadrature-related carrier-frequency waveforms with one of said quadrature-related baseband signals in one of said channels and the other carrier-frequency waveform with the other of said baseband signals in the other channel to form respective first and second signals in said one and other channels, and means for combining said first and second signals from said channels into a single frequency-modulated carrier-frequency output signal.

2. An arrangement for frequency-modulating telecommunication carriers with baseband signals, comprising means for generating two quadrature-related baseband signals in two separate channels, each of said quadrature-related baseband signals being a sinusoidal function of the instantaneous angle of a message signal to be transmitted, including a voltage-controlled oscillator operative for issuing an output signal in dependence on an input voltage level, means for issuing two quadrature-related sinusoidal baseband reference waveforms, means for forming a correction signal proportionate to the phase difference between said output signal of said voltage-controlled oscillator and one of said quadrature-related sinusoidal baseband reference waveforms, and means for feeding said correction signal and the message signal to said voltage-controlled oscillator to establish said input voltage level; and means for producing a frequency-modulated carrier from said quadrature-related baseband signals, including means for providing two quadrature-related carrier-frequency waveforms, means for individually mixing one of said quadrature-related carrier-frequency waveforms with one of said quadrature-related baseband signals in one of said channels and the other carrier frequency waveform with the other of said baseband signals in the other channel to form respective first and second signals in said one and other channels, and means for combining said first and second signals from said channels into a single frequency-modulated carrier-frequency output signal.

3. The arrangement as defined in claim 2, wherein said forming means includes phase-detecting means having one input receiving said output signal from said voltage-controlled oscillator, another input receiving said one reference waveform from said issuing means, and an output coupled to said feeding means.

4. The arrangement as defined in claim 3, and further including a low-pass filter interposed between said output of said phase-detecting means and said feeding means.

5. The arrangement as defined in claim 2, wherein said generating means further includes means for multiplying said output signal of said voltage-controlled oscillator in one of said channels by a first of said quadrature-related sinusoidal baseband reference waveforms and in the other of said channels by a second of said quadrature-related sinusoidal baseband reference waveforms to respectively generate the respective quadrature-related baseband signals in the respective channels.

6. The arrangement as defined in claim 5, wherein said forming means includes means for deriving one of said quadrature-related baseband signals from the respective channel.

7. The arrangement as defined in claim 6, wherein said generating means further includes filter means in each of said channels between the respective multiplying and mixing means.

8. The arrangement as defined in claim 7, wherein said filter means is low-pass filter means operative for passing only the respective quadrature-related baseband signals.

9. The arrangement as defined in claim 8, wherein said deriving means is connected to the respective channel between said multiplying and filter means; and wherein said forming means further includes additional filter means having an input connected to said deriving means and an output connected to said feeding means and operative for passing only that component of said one baseband signal received from said deriving means that carries information as to said phase difference and thus constitutes said correction signal.

10. The arrangement as defined in claim 2, wherein said issuing means includes a reference oscillator operating at a baseband frequency.

11. The arrangement as defined in claim 10, wherein said issuing means further includes at least one phase shifter receiving the output of said reference oscillator and issuing one of said quadrature-related sinusoidal baseband reference waveforms.

12. The arrangement as defined in claim 2, wherein said feeding means includes means for adding said correction signal to said message signal.

13. The arrangement as defined in claim 1, wherein said providing means includes a local oscillator operating at a carrier frequency.

14. An arrangement for generating quadrature-related baseband signals in two separate channels for use in frequency-modulating telecommunication carriers, comprising
- a voltage-controlled oscillator operative for issuing an output signal in dependence on an input voltage level;
- means for issuing two quadrature-related sinusoidal baseband reference waveforms;
- means for forming a correction signal proportionate to the phase difference between said output signal of said voltage-controlled oscillator and one of said quadrature-related sinusoidal baseband reference waveforms; and
- means for feeding said correction signal and a message signal to said voltage-controlled oscillator to establish said input voltage level.

15. The arrangement as defined in claim 14, wherein said forming means includes phase-detecting means having one input receiving said output signal from said voltage-controlled oscillator, another input receiving said one reference waveform from said issuing means, and an output coupled to said feeding means.

16. The arrangement as defined in claim 14, wherein said generating means further includes means for multiplying said output signal of said voltage-controlled oscillator in one of said channels by a first of said quadrature-related sinusoidal baseband reference waveforms and in the other of said channels by a second of said quadrature-related sinusoidal baseband reference waveforms to respectively generate the respective quadrature-related baseband signals in the respective channels.

17. The arrangement as defined in claim 16, wherein said forming means includes means for deriving one of said quadrature-related baseband signals from the respective channel.

18. The arrangement as defined in claim 17, wherein said forming means further includes filter means having an input connected to said deriving means and an output connected to said feeding means and operative for passing only that component of said one baseband signal received from said deriving means that carries information as to said phase difference and thus constitutes said correction signal.

19. An arrangement for producing a frequency-modulated telecommunication carrier from two quadrature-related baseband signals being respective in-phase and quadrature functions of a message signal to be transmitted and conveying information in two separate channels as to the modulation and deviation frequency components required for the frequency modulation, comprising
- means for providing two quadrature-related carrier-frequency waveforms;
- means for individually mixing one of said quadrature-related carrier-frequency waveforms with one of said quadrature-related baseband signals in one of said channels and the other carrier-frequency waveform with the other of said baseband signals in the other channel to form respective first and second signals in said one and other channels; and
- means for combining said first and second signals from said channels into a signle frequency-modulated carrier-frequency output signal.

20. A method of frequency-modulating telecommunication carriers with baseband signals, comprising the steps of
- generating two quadrature-related baseband signals being respective in-phase and quadrature functions of the instantaneous phase of a message signal to be transmitted;
- conveying the quadrature-related baseband signals in separate channels;
- providing two quadrature-related carrier-frequency waveforms;
- individually mixing one of the quadrature-related carrier-frequency waveforms with one of the quadrature-related baseband signals in one of the channels and the other carrier-frequency waveform with the other baseband signals in the other channel to form respective first and second signals in the one and the other channel, respectively; and
- combining the first and second signals from the channels into a single frequency-modulated carrier-frequency output signal.

21. A method of frequency-modulating telecommunication carriers with baseband signals, comprising the steps of
- generating two quadrature-related baseband signals each being a sinusoidal function of the instantaneous phase of a massage signal to be transmitted, including
  - issuing an oscillating output signal having a frequency dependent on an output voltage level,
  - producing two quadrature-related sinusoidal baseband reference waveforms,
  - forming a correction signal proportionate to the phase difference between the oscillating output signal and one of the quadrature-related sinusoidal baseband reference waveforms,
  - and utilizing the correction signal and the message signal to establish the input voltage level;
- conveying the quadrature-related baseband signals in separate channels;
- providing two quadrature-related carrier-frequency waveforms;
- individually mixing one of the quadrature-related carrier-frequency waveforms with one of the quadrature-related baseband signals in one of the channels and the other carrier-frequency waveform with the other baseband signal in the other channel to form respective first and second signals in the one and the other channel, respectively; and
- combining the first and second signals from the channels into a single frequency-modulated carrier-frequency output signal.

* * * * *